(12) United States Patent
Klootwijk

(10) Patent No.: US 7,791,162 B2
(45) Date of Patent: Sep. 7, 2010

(54) TRENCH ISOLATION STRUCTURE, SEMICONDUCTOR ASSEMBLY COMPRISING SUCH A TRENCH ISOLATION, AND METHOD FOR FORMING SUCH A TRENCH ISOLATION

(75) Inventor: Johan Hendrik Klootwijk, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/544,216

(22) PCT Filed: Dec. 16, 2003

(86) PCT No.: PCT/IB03/06321
§ 371 (c)(1),
(2), (4) Date: Aug. 1, 2005

(87) PCT Pub. No.: WO2004/068575
PCT Pub. Date: Aug. 12, 2004

(65) Prior Publication Data
US 2006/0131688 A1    Jun. 22, 2006

(30) Foreign Application Priority Data
Jan. 31, 2003    (EP)    .................... 03100207

(51) Int. Cl.
*H01L 29/00*    (2006.01)
(52) U.S. Cl. .................. 257/510; 257/506; 257/513

(58) Field of Classification Search ............... 257/510, 257/513, 520, 301; 438/424–426, 430–432
See application file for complete search history.

(56) References Cited

U.S. PATENT DOCUMENTS

| | | | | |
|---|---|---|---|---|
| 4,589,193 A | * | 5/1986 | Goth et al. | 438/430 |
| 5,581,110 A | | 12/1996 | Yindeepol et al. | |
| 5,811,315 A | | 9/1998 | Desantis | |
| 6,150,686 A | * | 11/2000 | Sugiura et al. | 257/301 |

FOREIGN PATENT DOCUMENTS

EP    0 425 965    5/1991

* cited by examiner

*Primary Examiner*—Ori Nadav

(57) ABSTRACT

The present invention provides a trench isolation structure, comprising a trench groove (4) in a semiconductor slab (1) with a buried layer (2). The trench groove (4) is lined with first insulating material (5), then filled with a first filler material (6) up to the level of the buried layer. Then second insulating material (7), for example an oxide, is preferably applied in the volume which is surrounded by the buried layer (2). The remaining part of the trench groove (4) is either filled with second filler material (8) or with second insulating material. Said structure provides lower capacitive coupling between buried layer (2) edge and substrate (1), with improved thermal behavior. The invention furthermore provides a semiconductor assembly comprising said trench isolation structure and at least one semiconductor device, as well as a method for forming such a trench isolation structure.

9 Claims, 4 Drawing Sheets

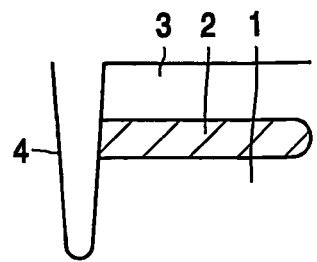
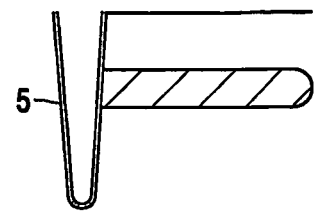
FIG. 3a  FIG. 3b
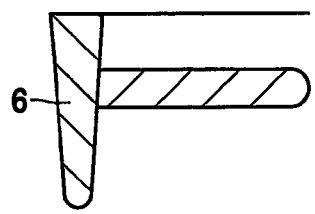
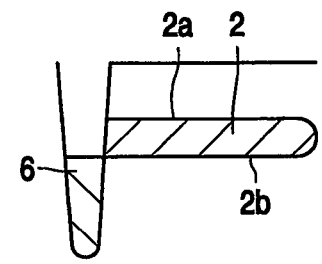
FIG. 3c  FIG. 3d
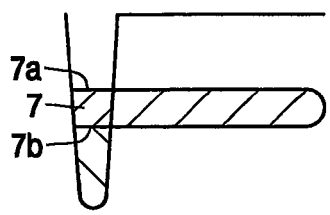
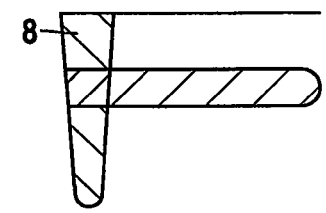
FIG. 3e  FIG. 3f
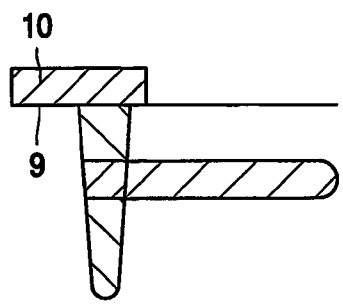
FIG. 3g

TRENCH ISOLATION STRUCTURE, SEMICONDUCTOR ASSEMBLY COMPRISING SUCH A TRENCH ISOLATION, AND METHOD FOR FORMING SUCH A TRENCH ISOLATION

The present invention relates to a trench isolation structure, comprising a slab of semiconducting material having a surface and a buried layer which extends parallel to the surface, and a trench groove which extends at least from the surface through the buried layer down to a part of the slab below the buried layer and which comprises a first insulating material having a thickness on a wall of the trench groove, and wherein a remaining part of the trench groove is at least partially filled with a first filler material.

Furthermore, the invention relates to a semiconductor assembly, comprising such a trench isolation structure, and at least one semiconductor device present on the surface of the slab of semiconducting material, wherein the semiconductor device is insulated by means of the trench isolation structure.

The present invention also relates to a method for forming a trench isolation in a semiconductor slab, comprising the steps of:

providing a slab of semiconducting material having a surface and comprising a buried layer parallel to and below the surface; forming a trench groove in the semiconductor slab, the trench groove having a bottom surface and a sidewall, and extending from the first surface through the buried layer and into the slab of semiconducting material; filling the trench groove at least with a first insulating material and with a first filler material, wherein the first insulating material covers at least the bottom surface and the sidewall in a layer having a thickness d, and wherein the first filler material at least partially fills a remaining part of the trench groove.

Generally, in high-performance bipolar and BiCMOS processes, deep trench isolation is applied in order to reduce parasitic capacitances, improve packing densities and improve device isolation. With decreasing device dimensions, an increasing part of the collector-substrate capacitance for minimum size transistors is contributed by the edge of the buried layer-substrate junction (perimeter contribution). With the use of a deep trench isolation which reaches through the buried layer, this contribution can be reduced significantly. Furthermore, collector-collector spacing can be reduced without violating breakdown demands. Ordinarily, in order to minimize collector-substrate capacitance, a material with low dielectric constant (e.g. silicon dioxide) would be preferable to fill up the trenches completely. However, a complete BiCMOS-process can introduce thermally induced stress, due to mismatch of the thermal expansion coefficients of the dielectric material and the silicon substrate. It can also influence electrical characteristics. Therefore, a polysilicon filled deep trench with a thin dielectric liner is generally applied.

U.S. Pat. No. 5,966,598 discloses a trench isolation structure and a method for forming such a trench isolation structure. The trench isolation structure comprises an epitaxial layer, a buried layer, a silicon substrate. Trench grooves extend vertically through the epitaxial layer and the buried layer. In one embodiment, a lower part of the trench groove, which part extends from the substrate all through the buried layer to the epitaxial layer, is filled with polysilicon, while a remaining part is filled with an insulator. In another embodiment, a silicon oxide film is present below the buried layer. The bottom surface of trench groove extends through the buried layer and reaches an interface between the silicon oxide layer and the buried layer. A first inter-layer insulator is formed on both vertical side walls and a bottom wall of each trench groove. Polysilicon films are provided which fill up lower regions of the trench grooves. A second inter-layer insulator is provided on the polysilicon films within the trench grooves so that the second inter-layer insulator fills up the upper region of the trench groove.

A problem with the known trench isolation structures is that they do not provide at the same time low parasitic capacitance values and minimum stress generated due to mismatch of thermal expansion coefficients. This limits the integration in a full BiCMOS process. It specifically limits the reduction of collector-collector spacing or minimum device dimensions in general.

It is an object of the present invention to provide an improved trench isolation structure of the indicated kind, which provides favourable parasitic capacitance values while ensuring at the same time good insulating properties and low thermally induced stress, when used in a semiconductor device assembly. In this way, a smaller minimum device assembly dimension becomes possible.

Said object is achieved by a trench isolation structure according to the invention, which is characterized in that at least in a first part of the trench groove which is surrounded by the buried layer, the thickness is larger than the thickness in a second part of the trench groove which is located below the first part.

The present inventor has found that with such a trench isolation, i.e. having a layer of first insulating material with a thickness at the level of the buried layer which is larger than the corresponding thickness below the buried layer, offers a sufficiently low parasitic capacitance, while the stress generated due to the mismatch of the thermal expansion coefficients is minimized. Furthermore, a separate insulating layer in the slab, such as the silicon dioxide layer in the case of the cited US patent, is no longer necessary. Hence a simpler construction with improved characteristics may be obtained.

Here, the words "surrounded by" indicate that the first part is located within a volume of the trench groove bounded by the sidewalls of the trench groove and by an upper surface and a lower surface which are at the same level or depth as an upper surface and a lower surface, respectively, of the buried layer. It is not necessary, though preferable, that the first part completely occupies the volume as described above.

Within the framework of the present invention, such words as "below", "above", "lower", "upper", and so on, are to be considered with respect to the semiconductor slab, as seen in a direction perpendicular to the surface thereof E.g. "below" means "at a greater depth below the surface of the semiconductor slab".

Generally, the semiconductor slab is a substrate, onto which the buried layer is deposited, or formed in any other fashion. On top of the buried layer, another layer of semiconducting material is formed. In most cases, this will be an epitaxial layer of semiconducting material. For this application, the assembly of the slab semiconducting material, the buried layer and the other (e.g. epitaxial) layer of semiconducting material is sometimes called the slab. It will be clear in which cases only the substrate, or lowest part of this assembly is meant.

The thickness of the first insulating material is a function of position in the trench groove, in particular of the depth below the surface of the slab. According to the invention, this thickness in the part of the trench groove located below the first part is smaller than the thickness in the first part.

Preferably, the thickness in the first part is larger than the thickness in a third part of the trench groove which is located above the first part. In this way it is ensured that the resulting region with first insulating material is as small as possible without giving up the advantages according to the present invention. In other words, the first insulating material is present only at the location where its effects are largest, in particular at the level of the buried layer. Since this buried layer can carry a relatively large part of (induced) currents, the insulating and capacitance properties at this level should preferably be optimum. However, it is possible that the thickness in the third part is larger than the thickness in the first part, e.g. if the trench groove has diverging sidewalls, the width being largest near the surface of the slab, and the first and third part of the trench groove are completely filled with the first filler material. In the case of a trench groove with parallel sidewalls, this effect is not likely to occur.

Advantageously, the first part is completely filled with the first insulating material. This means that only first insulating material is present in a cross-section taken through the first part of the trench groove, in a plane parallel with the plane of the buried layer. The advantageous properties, in particular the insulating properties, of a first part of such design are optimum. However, it is possible to use a first part which is partly filled with another suitable material, for example a first filler material. In such a first part, the first insulating material may come in a layer with an increased thickness when compared to the thickness in other parts of the trench groove.

In a preferred embodiment, the first part extends substantially in line with the buried layer. This means that the first part has an upper surface and a lower surface, which when extended coincide with the upper surface and the lower surface of the buried layer, respectively. The term "substantially" indicates that the distance between the associated lower surfaces and upper surfaces, respectively, may be up to 10% of the thickness of the buried layer, e.g. to account for unevenness in said surfaces. This way, the volume taken up by the first part is bounded by the layer of first insulating material on the sidewalls of the trench groove, and by the lower and upper surfaces of the second insulating material. For practical purposes, the first part may be thought of extending also to that part of the layer of first insulating material between the sidewalls and the volume of second insulating material.

A preferred first insulating material comprises an oxide material, more preferably silicon oxide. Silicon dioxide is a very good insulator with a favourably low dielectric constant. It also has the advantage that it is very easy to provide the trench groove with silicon dioxide. This may be done e.g. by means of deposition via tetra ethyl ortho-silicate (TEOS), or high density plasma deposition (HDP). Other methods like oxidizing the silicon of the slab are not excluded, however.

An advantageous first filler material comprises silicon, preferably polysilicon. This material is very suitable to ensure favourable thermal behaviour, since it differs little or not from the material of the semiconductor slab itself. Of course, if the semiconductor slab comprises a different material, e.g. germanium, or gallium arsenide, the first filler material could be selected accordingly, preferably the corresponding semiconducting material.

The invention provides an advantageous semiconductor assembly, comprising a trench isolation structure according to the invention, and at least one semiconductor device present on the surface of the slab of semiconducting material, wherein the semiconductor device is insulated by means of the trench isolation structure.

Such a semiconductor assembly may offer faster switching speed and/or improved thermal behavior at smaller dimensions. Furthermore, such an assembly may be fabricated with a smaller distance between the semiconductor devices, in the case of multi-device assemblies. This is allowed by the trench isolation structure according to the invention, which offers an improved combination of insulating and thermal stress properties at the same inter-device distance, or equal such properties at a reduced inter-device distance, when compared to conventional trench isolation structures.

Although the semiconductor device in an assembly according to the invention is not particularly limited, the semiconductor devices preferably comprise transistors, and more preferably bipolar or bipolar transistors in a BiCMOS process. The demands with respect to such components are very high, and improvements in respect of their application are very important throughout the semiconductor and electronics industry.

The method by which a trench isolation structure according to the invention is obtained is not critical, as long as it results in the advantageous described trench isolation structure. However, the invention provides a preferred method of the kind mentioned in the introduction, characterized in that at least in a first part of the trench groove which is surrounded by the buried layer, the thickness is made larger than the thickness in a second part of the trench groove which is located below the first part.

As mentioned hereinbefore, by selecting the thickness as indicated, the favourable combination of good capacitance properties and reduced thermal stress can be obtained.

In an advantageous method, the thickness in the first part of the trench groove is made larger than the thickness in a third part of the trench groove which is located above the first part. The same advantages as described in respect of a preferred trench isolation structure hold for this method.

The step of filling the trench groove in a way proposed by the present invention is not particularly limited. Any method known in the art to provide the layer of first insulating material with the indicated thickness d, as well as the filling with the first filler material may be used. Preferably however, the step of filling the trench groove comprises the steps of covering the bottom surface and the sidewalls of the trench groove with a layer of first insulating material; filling the trench groove with a first filler material at least to a lower surface level of the buried layer; removing the first filler material down to a level which is substantially flush with the lower surface level of the buried layer; and filling the remaining part of the trench groove at least partially with a second insulating material.

This offers a very simple method of forming a trench isolation according to the invention, with a minimum number of steps, and hence with increased reliability.

As the first insulating material in principle any material known in the state of the art may be selected. However, preferably silicon dioxide is selected. Said silicon dioxide may for example be deposited by means of tetra ethyl ortho-silicate (TEOS). Any other insulating material may be used as well however. Preferably, the second insulating material comprises the same material as the first insulating material. However, said insulating materials may be obtained by means of different processes, or may be different materials altogether. The thickness of the layer can have any desired value, as long as the insulating properties are satisfactory. Preferably, the minimum thickness is at least 100 nm.

The next step is the filling of the trench with the first filler material at least to a lower surface level of the buried layer. The lower surface level of the buried layer is meant to indicate that surface of the buried layer which lies deepest in the slab of semiconducting material. Said step of filling the trench with the first filler material may be performed according to any known method. Said filling step comprises filling the remaining part of the trench at least to the lower surface level of the buried layer, and more preferably completely filling the remaining part of the trench groove, with the first filler material. It further comprises the step of removing the first filler material down to a level which is substantially flush with the lower level of the buried layer. In this way, a very good control over the properties of the first filler material can be obtained.

The next step is filling the remaining part at least partially with a second insulating material. As mentioned before, the second insulating material may be the same material as the first insulating material, or may be substantially be the same material but obtained through a different method, or may be different from the first insulating material. Examples are silicon dioxide obtainable by means of deposition from TEOS, or by HDP.

Advantageously, the step of filling the remaining part with the first filler material is followed by the steps of removing the second insulating material down to a level which is substantially flush with an upper surface level of the buried layer, and filling the remaining part of the trench groove with a second filler material.

The second filler material may be the same as the first filler material. However, in many cases it will be preferably to then cover said second filler material with a protective layer, e.g. another insulating material such as an oxide. Hence it may be preferred to use a different second filler material, which need not be covered with yet another material. However, care should be taken not to affect the thermal and/or electrical properties of the trench isolation structure.

In a preferred embodiment, the step of removing the first filler material and/or of the second insulating material comprises etching the material. Although the step of removing the first filler material may be performed by any known method, etching by means of any appropriate etchant is preferred, because of the good control over the properties of the materials left behind, in particular the surface quality and purity.

The invention will now be explained in more detail, with reference to the accompanying drawings, in which.

Figure 1:
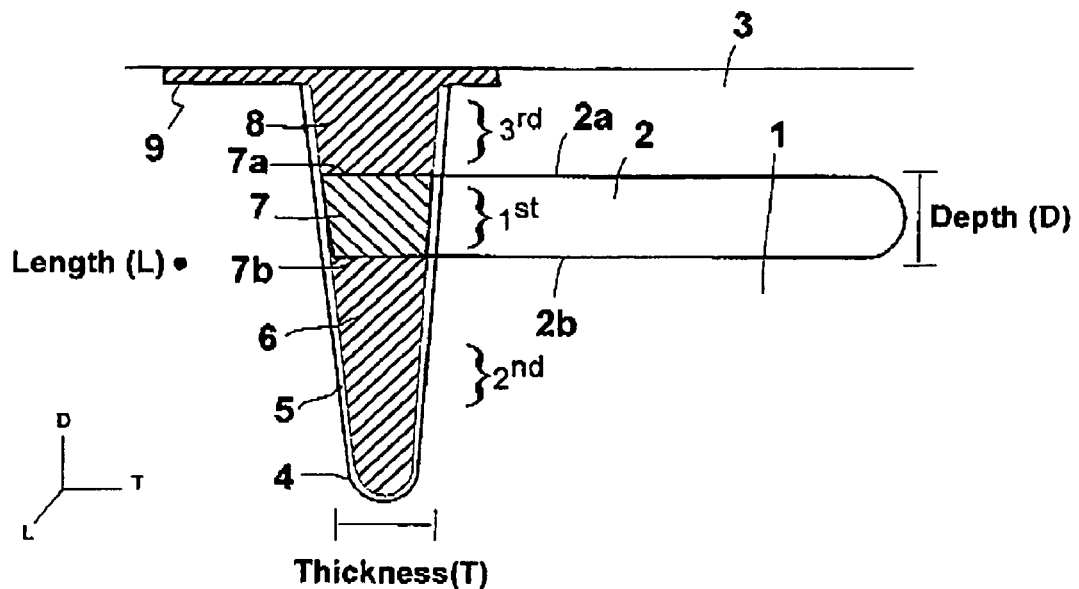
FIG. 1 shows in cross-section a first embodiment of the trench isolation structure according to the invention.
Figure 2:
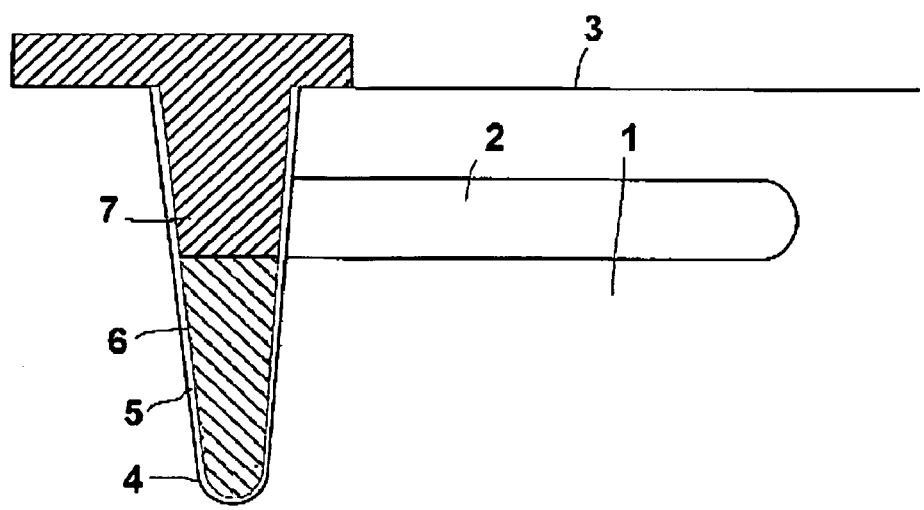
FIG. 2 shows in cross-section a second embodiment of the trench isolation structure according to the invention.
Figure 4A:
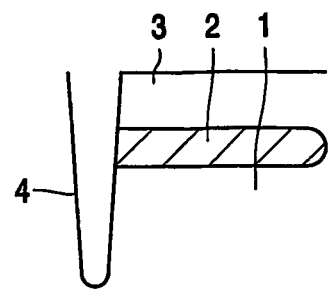
Figure 4B:
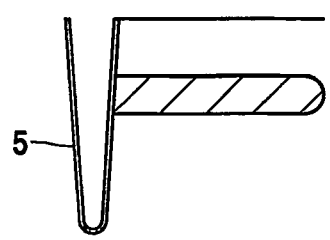
Figure 4C:
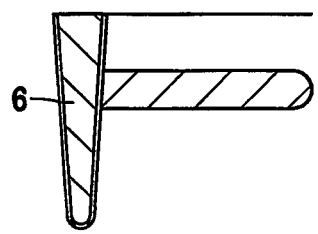
Figure 4D:
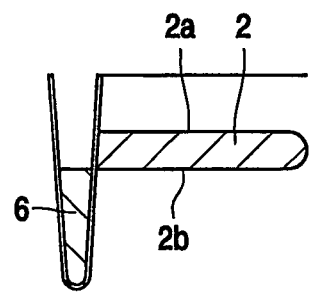
Figure 4E:
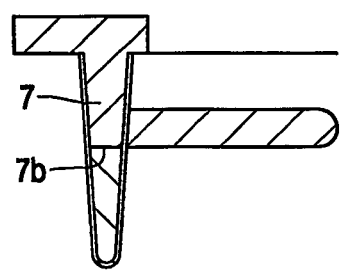
Figure 5:
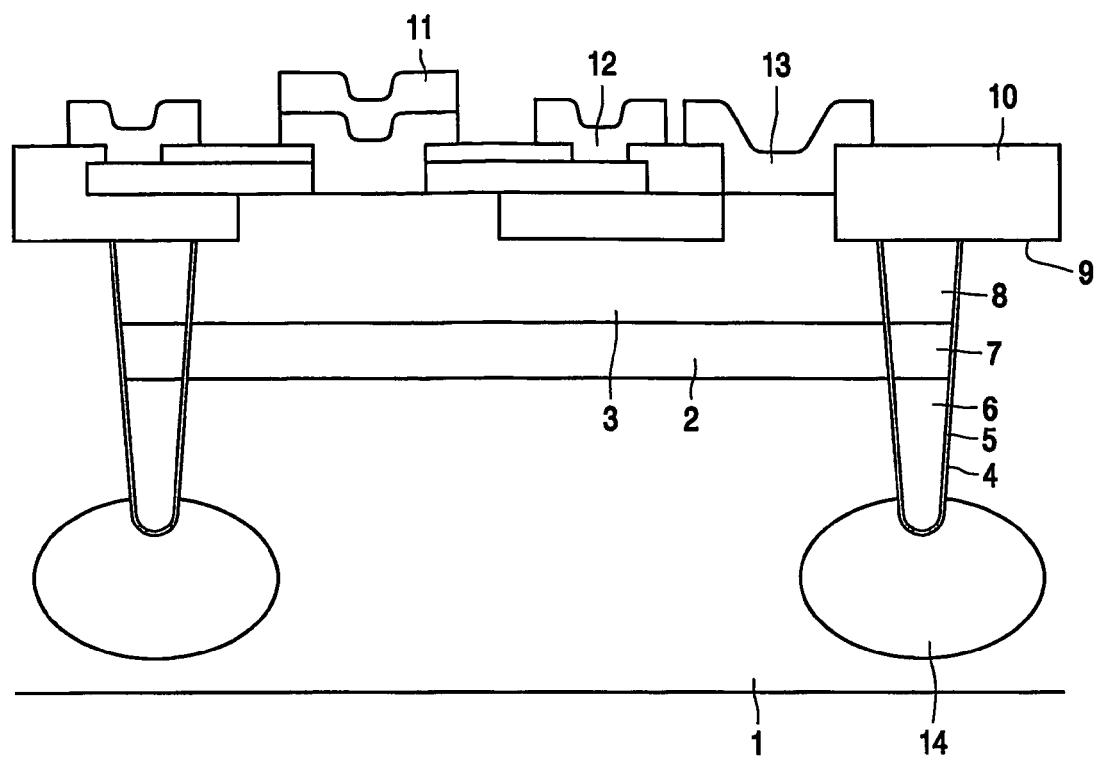

FIGS. 3a-g show a block diagram of the first embodiment of the method according to the invention, resulting in the trench isolation structure of FIG. 1;

FIGS. 4a-e show a block diagram of the second embodiment of the method according to the invention, resulting in the trench isolation structure of FIG. 2; and FIG. 5 shows a diagrammatic cross-section of a semiconductor device isolated by means of trench isolation structures according to the invention.

Figure 6:
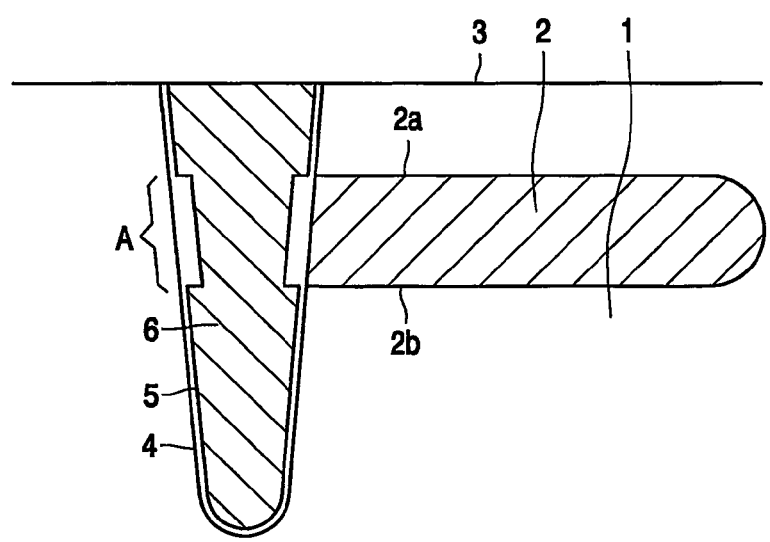

FIG. 6 shows a diagrammatic third embodiment of the trench isolation structure according to the invention.

In FIG. 1, 1 indicates a semiconductor slab, 2 denotes a buried layer, having an upper surface 2a and a lower surface 2b, and 3 denotes an epitaxial layer.

A trench groove is indicated by 4. The trench groove 4 comprises a liner 5 of a first insulating material, a first filler material 6, a second insulating material 7, having an upper surface 7a and a lower surface 7b and a second filler material 8.

A shallow trench is indicated by reference numeral 9.

The semiconductor slab 1 is made of silicon, or another suitable semiconducting material, and serves as a substrate for e.g. semiconductor devices. Here, the slab of semiconducting material is a lightly doped p material (p−), although n materials are not excluded. As shown in FIG. 1, the trench structure, according to an embodiment of the present invention, is depicted in three parts, a $1^{st}$ part, $2^{nd}$ part, and a $3^{rd}$ part, so as to aid in the discussion herein.

The buried layer 2 consists of a layer of heavily doped material having opposite polarity, here (n+). Generally, it has a layer shape with substantially flat and parallel upper and lower surfaces 2a and 2b, respectively. The buried layer may be fabricated by any known method, e.g. deposition techniques, ion implanting etc.

On top of the buried layer an epitaxial layer 3 is deposited, again through any known technique. Here the epitaxial layer 3 consists of lightly doped semiconductor material having a negative polarity, hence n− material.

It should be noted that, for the purposes of this invention, the assembly of semiconductor slab 1, buried layer 2 and epitaxial layer 3 is sometimes also called the semiconductor slab. The context will indicate clearly the cases whether the assembly is meant, or whether specifically the semiconductor slab, or substrate, is meant.

The dimensions of the features may be described in reference to FIG. 1, a cross-section of the structure according to an embodiment of the present invention. For the purposes of discussion, a "thickness" of a feature is measured in a horizontal direction parallel to the surface of the semiconductor slab, as denoted in the FIG. 1. A "depth" of a feature would be a measured in a direction perpendicular to the surface of the semiconductor slab, also denoted in FIG. 1. The "length" of a feature is measured in a direction perpendicular to the cross-section, denoted in FIG. 1.

A trench groove 4 is formed in the assembly of epitaxial layer 3, buried layer 2 and semiconductor slab 1. The trench groove 4 should be deep enough to go through the buried layer 2, and extend into the semiconductor slab 1, in order to optimally insulate the one or more parts to be insulated. This is called a deep trench isolation.

The shape of the trench groove 4 may vary according to requirements. However, it will mostly be in the form of a trench groove of some length, extending substantially perpendicularly with respect to the surface of the semiconductor slab 1, 2, 3. In some cases, though, it may be advantageous to form trench grooves which extend non-perpendicularly, e.g. slanting, with respect to the surface of the semiconductor slab.

The sidewalls of the groove may be substantially parallel, as may be obtained by e.g. certain etching techniques, or they may be slightly tapering towards a bottom surface of the trench groove. The latter means a slightly larger maximum width of the trench groove 4, but allows a better control over the filling of the trench groove.

The trench groove 4 is covered with a layer or liner of a first insulating material 5 on its sidewalls and bottom surface, i.e. completely. Here the first insulating material is silicon oxide, deposited by means of TEOS, to a layer thickness of e.g. 125 nm. In most cases, the first insulating material will be produced by oxidizing the material of the sidewall. Besides TEOS, other methods may be used, such as HDP (high density plasma oxides), and HTO (high temperature oxides). Moreover, it is also possible to deposit an altogether different material, of course having desirable insulating and dielectric properties (low ∈). Many such materials are known to the person skilled in the art. The layer thickness indicated here, and throughout the rest of this application, depends on the insulating material used. More specifically, the lower the ∈ of the material, the thinner the layer may be. For the oxides discussed here, it turned out that a layer thickness of 100 nm or more is desirable to obtain a sufficiently low capacitive coupling.

In a lower part or bottom part of the trench groove 4 up to the lower surface 7b of second insulating material, to be described below, a first filler material 6 is present, in this case polycrystalline silicon (polysilicon) deposited by means of LPCVD (low pressure chemical vapour deposition) or other processes. Minimum thermal expansion coefficient mismatch with the surrounding semiconductor material is guaranteed.

In FIG. 1, a second insulating material 7 is present and occupies a volume which is in line with the buried layer. The volume has a lower surface 7b and an upper surface 7a, tangent planes through which substantially coincide with lower surface 2b and lower surface 2a of the buried layer, respectively. In practice, surfaces 2a and 7a on the one hand, and/or surfaces 2b and 7b on the other hand, may be present at depths which differ from each other slightly, say max. 10% of the thickness of the buried layer. Experiments and measurements have shown that with this configuration, very good electrical properties can be obtained, while the possibly inducable thermal stress is kept to an acceptable minimum. Specifically, the capacitance values at the perimeter (or "edge") of the buried layer, where it is penetrated by the trench groove, are good, i.e. low. Said capacitance value is notably lower than in the case of a completely polysilicon filled trench groove.

In a first approximation, the capacitive coupling between the buried layer and the substrate (semiconductor material) in a homogeneously filled trench isolation structure is determined by a series connection of three capacitances. These are the capacitance of the oxide liner, the capacitance of the filling of the trench, and the capacitance of the oxide liner (i.e. of the opposite wall of the trench). Assuming that in each case the capacitance is set equal to the dielectric constant divided by the thickness of the layer ($\in_{ox}$, $t_{ox,1}$ or $t_{ox,2}$ for the first and second oxide liner, and $\in_{diel}$ and $t_{diel}$ for the filler material), then the total capacitance $C_{tot}$ can be shown to equal $$C_{tot} = \in/(t_{ox,1} + (\in_{ox}/\in_{diel})t_{diel} + t_{ox,2}) \tag{1}$$

In the case of silicon dioxide as the oxide liner, i.e. the first insulating material, $\in=3.9$. When the trench is filled with polysilicon, we have $\in=11.9$, hence a large capacitive coupling. On the other hand, when silicon dioxide is the filler material, we have $\in=3.9$, and a much smaller capacitive coupling. Hence, filling all of the trench groove with low $\in$ dielectric material gives the best capacitive values, albeit at the cost of a worse thermal behavior, as discussed previously.

It can be shown that the calculation of the capacitive coupling still holds for a trench groove which is only partly filled with oxide material, provided this oxide material is present at the level of the buried layer. Hence it is preferable to apply the oxide material only at the level of the buried layer. Of course there should still be a liner on the sidewall of the trench groove, of oxide or another suitable insulating material.

FIG. 2 shows a second preferred embodiment, which is somewhat easier to fabricate. It is to be noted that, in this and the following Figures, like reference numerals refer to corresponding parts. For brevity, those parts will not always be elucidated.

In this embodiment, the "slab" comprises a semiconductor slab 1, a buried layer 2, and an epitaxial layer 3. A trench groove 4 is lined with a first insulating material 5, and a lower part of the trench groove 4, up to a lower surface 2b of the buried layer, is filled with a first filler material 6. The rest of the trench groove 4, in this case but not necessarily including shallow trench 9, is filled with a second insulating material 7.

In certain cases, e.g. semiconductor assemblies with lower thermal demands, this simpler configuration shows sufficiently improved capacitive coupling values, without the difference in thermal expansion coefficients being too much of a burden.

FIG. 3a-g show a block diagram of a first embodiment of the method according to the invention, resulting in the trench isolation structure of FIG. 1.

FIG. 3a shows a slab comprising a semiconductor slab 1, a buried layer 2 and an epitaxial layer 3. In the slab a trench groove 4 has been formed, e.g. by etching.

In a next step, shown in FIG. 3b, the side- and bottom walls of the trench groove 4 are covered with an oxide liner 5, through a TEOS process or similar. It is to be noted that this detail of the oxide liner is omitted in the FIGS. 3c-g for clarity reasons.

FIG. 3c shows a step of filling (by depositing etc.) the trench groove 4 with polysilicon as a first filler material 6. Although FIG. 3c indicates that the trench groove is filled completely, it is to be understood that it is only necessary to fill the trench groove at least up to the lower surface level 2b of the buried layer 2.

As a next step, shown in FIG. 3d, any polysilicon above the lower surface level 2b of the buried layer 2 is removed, e.g. by etching back the polysilicon.

FIG. 3e shows the next step of depositing second insulating material 7, here silicon dioxide, up to the level of the upper surface of the buried layer 2. It is to be noted that, strictly speaking, there will be some deposition of material on top of the layer of first insulating material. However, especially in the case of V-shaped trench grooves, a sufficient opening will remain, in which filler material may be deposited. If necessary, i.e. if the width of the trench would have become too small, a short high frequency "dip" or the like may be used to etch open the upper part of the trench groove.

As a next step shown in FIG. 3f, a remaining part of the trench groove 4 is filled with second filler material 8, here polysilicon. In this case, the first 6 and second filler material 8 are the same.

As a final step, shown in FIG. 3g, oxide material 10 is deposited in order to fill the shallow trench 9.

The result of the steps of the method shown in FIG. 3a-g is a trench isolation structure according to the invention, which is furthermore protected at its surface by means of an oxide layer.

FIG. 4a-e show a block diagram of a second embodiment of the method according to the invention, resulting in the trench isolation structure of FIG. 2.

Steps and FIGS. 4a-d correspond to steps and FIGS. 3a-d, and will not be explained in more detail, for the sake of brevity.

FIG. 4e shows a final step, in which all of the remaining part of the trench groove 4 and the shallow trench 9 as well are filled with second insulating material 7. Since the second insulating material 7 has two functions to fulfill, it may be advantageous to select a somewhat different material. However, in many cases silicon dioxide will be a good choice.

FIG. 5 shows a diagrammatic cross-section of a semiconductor device isolated by means of trench isolation structures according to the invention.

Again, like reference numerals indicate like parts, which holds for numerals 1 through 10. Furthermore, a semiconductor device is schematically indicated by emitter 11, base 12 and collector 13, while 14 indicates a channel stopper known in the art, to improve the properties of the trench isolation structure. The parts 11-14 may be fabricated by any method known in the art. Furthermore it is to be noted that the parts to be insulated are not limited to such mentioned parts as transistor components base, collector and emitter. Yet in many cases they will actually be transistors, particularly bipolar or BiCMOS transistors.

The semiconductor device 11, 12, 13 is effectively insulated by means of the left and right trench isolation structures. Note that these may be two cross-sections of a single trench groove encircling the semiconductor device.

By means of the trench isolation structure the parasitic capacitive coupling between (in this case) collector and substrate is reduced significantly, which means that switching speeds may be increased. Furthermore, since the assembly of semiconductor device insulated by means of the inventive trench isolation structure is more resistant to thermally induced stress, a further decrease of inter-device distance may be obtained. This may further increase the switching speed of the device. Of course, these advantages are more explicit in integrated devices, in which large numbers of devices are close together, than in single transistor devices.

FIG. 6 shows a diagrammatic third embodiment of the trench isolation structure according to the invention. Here, the first part comprises a non-continuous layer (as seen in cross-section) of first insulating material 5.

Actually, the thickness of the oxide liner on the sidewalls is increased locally in part A as compared to the thickness thereof on the rest of the sidewall. Such local increase in oxide liner thickness may be obtained in a number of ways. E.g. it is possible to start with a trench groove, the sidewalls of which have been lined with the first insulating material (oxide liner) up to a certain thickness, say 100-150 nm. Next, the trench groove is filled with a first filler material up to a lower surface level 2b. Next, the thickness of the oxide liner is increased by depositing more first insulating material on the already existing oxide liner.

A following step would be to anisotropically etch back the first insulating material from the top of the first filler material in the trench groove, followed by filling the groove with first filler material up to the upper surface level 2a. As a next step, the oxide liner in the part of the sidewalls above the upper surface level is selectively etched back e.g. to the original thickness, i.e. the layer thickness in the lower part of the trench groove.

In a final step the remaining part of the trench groove can be filled with first filler material. In some cases, the trench isolation structure thus obtained can provide even better control over the capacitance values, and even less problems due to thermally induced stress.

Here the first insulating material 5 has an increased thickness in first part A, located between upper surface level 2a and lower surface level 2b. The rest of the trench groove 4 is filled with first filler material 6.

Other ways and methods to obtain the configuration as described above are possible and known in the state of the art, although it will be understood that generally these are much more complicated than the methods described in connection with FIGS. 1-5. In particular, the methods and construction as shown in connection with FIG. 6 may be useful for structures in which the semiconductor material comprises Si. Yet the described and other advantages can be obtained in a configuration in which the trench isolation structure having an increased insulating material layer thickness at the level of the buried layer.

The invention claimed is:

1. A semiconductor structure, comprising:
a slab of semiconducting material having a surface and a buried layer which extends parallel to the surface, the buried layer having an upper surface and a lower surface; and
a trench groove extending at least from the surface through the buried layer down to a part of the slab below the buried layer and
the trench groove including a liner of a first insulating material on a wall of the trench groove, and
wherein a remaining part of the trench groove is at least partially filled with a first filler material configured to provide trench isolation, and wherein the liner is characterized by an abrupt increase in thickness in at least a first part of the trench groove that is substantially in line with the buried layer, the abrupt increase in thickness defining a thickness that is larger than a thickness of the liner in a second part of the trench groove, the second part of the trench groove located below the first part.

2. A semiconductor structure according to claim 1, characterized in that the thickness of the liner in the first part of the trench groove is larger than a thickness of the liner in a third part of the trench groove, the third part of the trench groove located above the first part of the trench groove.

3. A semiconductor structure according to claim 1, characterized in that the trench groove is completely lined with the first insulating material.

4. A semiconductor structure according to claim 3, characterized in that the first part of the trench groove extends substantially in line with the buried layer.

5. A semiconductor structure according to claim 1, wherein at least one semiconductor device is at least partially present on the surface of the slab of semiconducting material, and wherein the semiconductor device is insulated by the trench isolation structure.

6. A semiconductor structure comprising:
a slab of semiconducting material having a surface and a buried layer which extends parallel to the surface;
a trench groove extending at least from the surface through the buried layer down to a part of the slab below the buried layer, the trench groove having a wall that is at least predominately lined and covered by a first insulating material from above an upper surface of the buried layer to below a lower surface of the buried layer, and the first insulating material for providing trench isolation and having a common thickness above and below the buried layer and having an increased thickness in at least part of the trench groove that is substantially in line with the buried layer; and
a first filler material at least partially filling a remaining part of the trench groove in areas above and below the buried layer.

7. A semiconductor structure according to claim 6, characterized in that the increased thickness is defined by abrupt transitions respectively located near the upper surface of the buried layer and near the lower surface of the buried layer.

8. A semiconductor structure according to claim 6, characterized in that the increased thickness is substantially in line with the buried layer.

9. A semiconductor structure according to claim 6, characterized in that the part of the trench groove extends substantially in line with the buried layer.

\* \* \* \* \*